United States Patent
Wright et al.

(10) Patent No.: US 7,061,108 B2
(45) Date of Patent: Jun. 13, 2006

(54) SEMICONDUCTOR DEVICE AND A METHOD FOR SECURING THE DEVICE IN A CARRIER TAPE

(75) Inventors: Lance C. Wright, Van Alstyne, TX (US); Albert D. Escusa, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/677,435

(22) Filed: Oct. 2, 2003

(65) Prior Publication Data

US 2005/0073037 A1   Apr. 7, 2005

(51) Int. Cl.
*H01L 23/04*   (2006.01)
*H01L 23/48*   (2006.01)
*H01L 23/28*   (2006.01)

(52) U.S. Cl. .................... 257/730; 257/702; 257/696; 257/787

(58) Field of Classification Search ............... 257/730, 257/702, 787, 696; 206/714, 764, 765
See application file for complete search history.

(56) References Cited

U.S. PATENT DOCUMENTS

| 4,918,513 | A | * | 4/1990 | Kurose et al. ............... 439/73 |
| 5,371,408 | A | * | 12/1994 | Moulton et al. ............ 257/730 |
| 5,396,988 | A | * | 3/1995 | Skrtic ....................... 206/714 |
| 6,525,405 | B1 | * | 2/2003 | Chun et al. ................ 257/666 |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

A method for packing a semiconductor device 301 in a carrier tape 406 without damage to the leads 302 includes an interlocking mechanism between the molded semiconductor device with indentations 305 formed into the package body, and the carrier tape having mating protrusions 407 slightly smaller than the indentations which cause the device to be held securely without significant movement after a cover tape 409 is adhered to the carrier tape. The features of correctly sized pockets and pedestals, the cover tape, and the interlocking device indentations and tape protrusions prevent damage to the device leads as a result of impact.

3 Claims, 4 Drawing Sheets

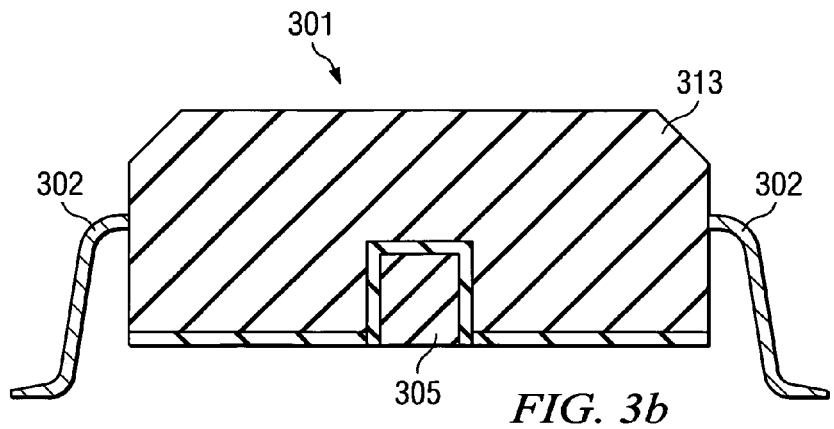
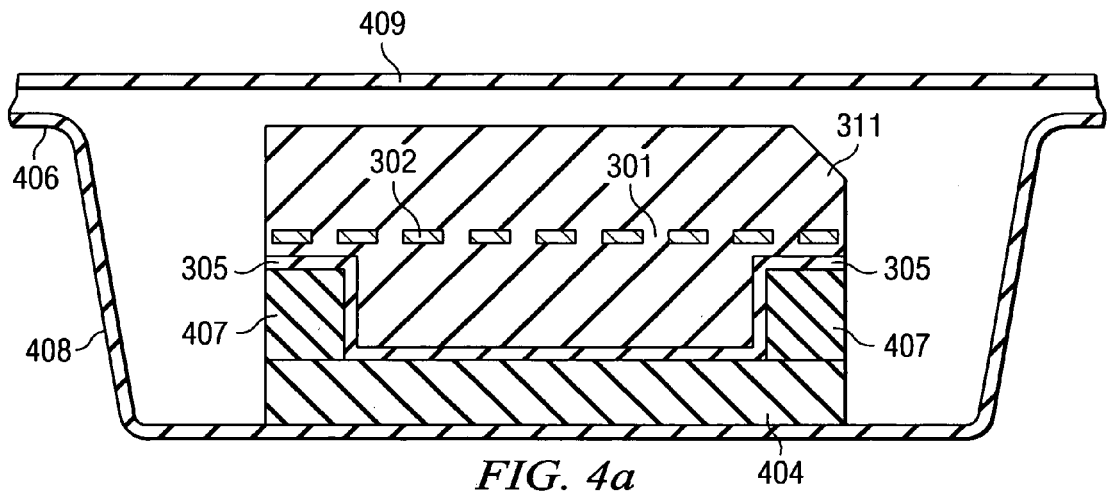
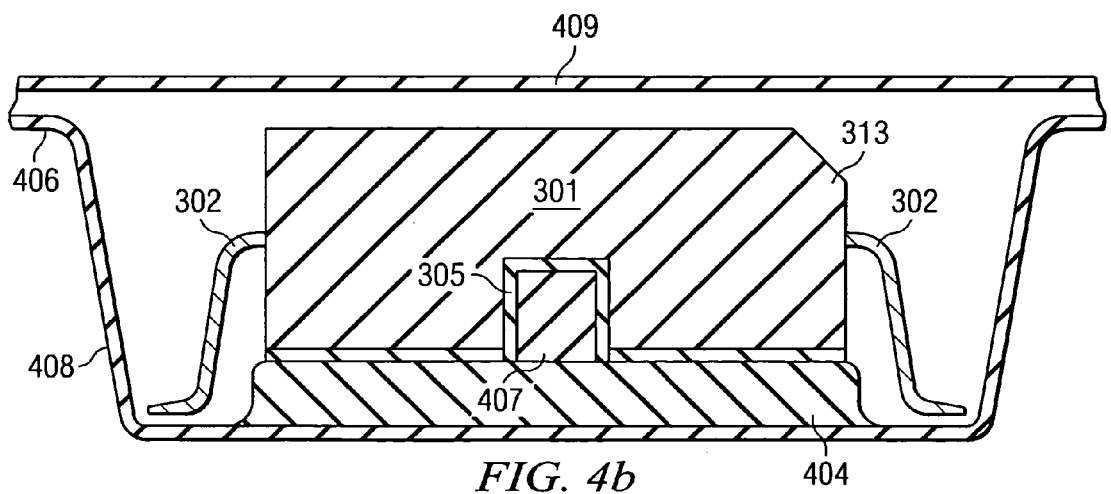

SEMICONDUCTOR DEVICE AND A METHOD FOR SECURING THE DEVICE IN A CARRIER TAPE

FIELD OF THE INVENTION

The invention relates generally to a shipping container for a semiconductor device and more particularly to a method for use of an interlocking carrier tape and semiconductor device.

BACKGROUND OF THE INVENTION

In the production of semiconductor devices, it is necessary that the devices be adequately protected during handling and transporting of the finished parts in order to avoid mechanical damage to the lead tips, the lead finishes, or the assembled packages. The need for protection extends to avoiding damage from static charges or from corrosive environments. Further, the devices must be transported in carriers which are compatible with the customer's in-house manufacturing equipment.

For customers requiring large numbers of identical electronic components, the finished devices 101 are frequently handled in elongated strips of sealed embossed tape 103 having a series of recesses 102 or pockets, as illustrated in FIG. 1. Such a carrier tape 103 normally comprises a flexible plastic material having pockets 102 sized to accommodate correspondingly sized devices 101, with one device being placed in each pocket. The pockets are arranged along the length of the tape 103, and for smaller devices adjacent pockets are positioned across the tape width. The tape edges include perforations for utilization in indexing machines. A cover tape 104 adhered to the horizontal top edges of the carrier tape secures the devices in the pockets.

Typically, at the electronic components manufacturing site the inline process includes removing an empty carrier tape 103 from a reel 105, inserting a semiconductor device 101 in each pocket, sealing the cover tape 104 along the edges of the carrier tape, and rewinding the loaded tape onto a second reel (not shown). At the customer's site, a section of the tape is unwound, the tape covering the devices to be assembled onto a printed circuit board or other interconnection circuitry is removed, and the components are removed from the pockets for final assembly or for testing.

IC devices such as SOIC (small outline IC), TSSOP (thin small outline), SSOP (very small outline) and QFP (quad flat package) include gull wing shaped metal leads spaced in close proximity to each other. The leads, frequently of a copper alloy, are fragile and must be protected from surface damage or deformation. Damaged leads hinder the next process step, such as testing or soldering the device onto a printed circuit board.

As illustrated in FIG. 2a, a carrier tape typically utilizes a pedestal 206 to support the device 201 in the pocket 202. The body of the device rests on the pedestal 206 and is held vertically by the cover tape 209. Other carrier tapes 213, as shown in FIG. 2b, confine the body of the semiconductor component 211 by use of ridges 216 that nest under the shaped leads 218 and next to the body such that the free ends of the leads 211 are spaced away from and ideally do not engage the sidewalls of the pocket 212. The component 211 is centered in the pocket 212 by this design. A cover tape 219 completes the assembly.

However, upon impact from intentional drop testing or from unintentional mishandling, either tape design is inadequate. The component may escape the supporting features and collide with the vertical sidewalls of the pocket. The impact results in damaged leads. If fact, ridges within the pocket may contribute to bending of the leads because as the device is dislodged a lead may be caught straddling a ridge and become damaged.

Therefore, a need exists in the industry for methods to protect electronic components shipped in carrier tapes from damage to the leads and rendering them useless after completing costly fabrication.

SUMMARY OF THE INVENTION

In accordance with an embodiment of the invention, a process is provided to protect fragile leads of semiconductor devices housed and transported in carrier tapes. The process includes providing a carrier tape having protrusions from the inner surface of the pocket which are matched to indentations in the body of the packaged semiconductor device, aligning and positioning the device atop the protrusions so that the indentation and protrusion are interlocked, and securing the component by sealing a cover to the tape edges. The cover tape along with the supporting pedestal in the correctly sized pocket of the carrier tape secure the device vertically, and the interlocking features in the device and carrier tape secure the device horizontally so that the device leads are isolated from side walls of the tape, and thus are protected from damage on impact.

In one embodiment, a dual inline package having leads on two opposing sides is interlocked to the carrier tape by molding notches into the sides of a semiconductor package having no leads, and fabricating mating protrusions into the tape. The protrusions are slightly smaller than the notches so that they may fit inside the notches. In this embodiment, the notches may extend through the thickness of the package, or may be about 0.25 mm or greater in depth from the package underside.

In another embodiment, preferred for semiconductor devices having leads protruding from more than two sides, indentations are molded into the underside of the device and mating protrusions are formed in the pedestal of the carrier tape. Preferably, the locking features of the protrusions and indentations on the semiconductor device are circular or multisided in shape. Indentation and mating protrusion features are in the range of 0.1 mm to 0.32 mm in depth.

It is preferable that more than one locking feature is used to lock each component to the carrier tape in order to avoid rotation of the device which in turn could allow the leads to come into contact with side walls of the carrier. Locking protrusions are readily formed in carrier tapes of a semiflexible, deformable material, such as a plastic.

The unique interlocking assemblage including a semiconductor device with indentations formed into the package body, and a carrier tape having mating protrusions slightly smaller than the indentations allow the device to be held securely without significant movement after a cover tape is adhered to the carrier. The combined features of a tape pocket with pedestal and cover tape and the interlocking device and tape features eliminate damage to the component leads as a result of impact.

BRIEF DESCRIPTION OF THE DRAWINGS

FIG. 3b is view of a gull wing dual inline package from a side having no leads and having a notch formed partially through the package body.

FIG. 4a is a cross section through the length of a dual inline semiconductor package with notches atop interlocking protrusions.

FIG. 4b is a view of a dual inline package having notches interlocked with protrusions in the carrier tape.

DETAILED DESCRIPTION OF PREFERRED EMBODIMENTS

A method for protecting fragile leads of a semiconductor device housed and transported in a tape carrier package is made possible by first providing a semiconductor package and a carrier tape having interlocking features which help prevent the device from moving laterally within the tape pocket, positioning the device atop the pedestal within the tape pocket, and adhering a cover tape to the carrier tape edges. The interlocking features avoid lateral movement of the device, and the pocket, pedestal and cover tape secure the device vertically.

Figure 3A:
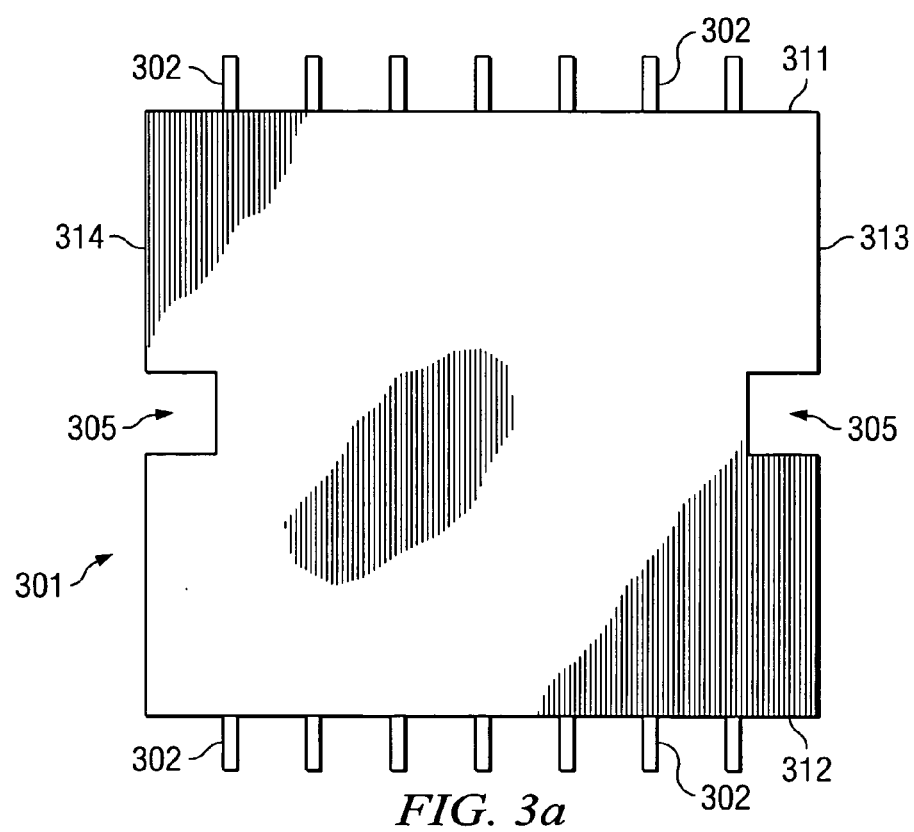
FIG. 3a is a top view of a dual inline package having a notch molded completely through the package sides having no leads.

A first embodiment of the invention provides a method whereby a dual inline semiconductor package 301 as illustrated in FIGS. 3a and 3b, having gull wing shaped leads 302 protruding from the two opposing sides 311,312 is secured in a carrier tape so as to avoid damage to the fragile device leads. The dual inline semiconductor package, such as a TSOP, TSSOP, or SOIC, is provided preferably by molding a notch 305 or other form of indentation into the two sides 313 and 314 having no protruding leads. The notches 305 may be formed completely through the thickness of the semiconductor package body, as illustrated in FIG. 3a, or may be molded to a depth of about 0.25 mm or greater from the package underside, as shown in FIG. 3b. The notches, semicircular, three sided, "V", or a similar shape, are centered in the package sides 313, 315 and are in the range of 0.15 to 0.5 mm in width at the widest point. Notches are preferably excluded from areas of the device where leads, chips, or chip pads are present.

Figure 1:
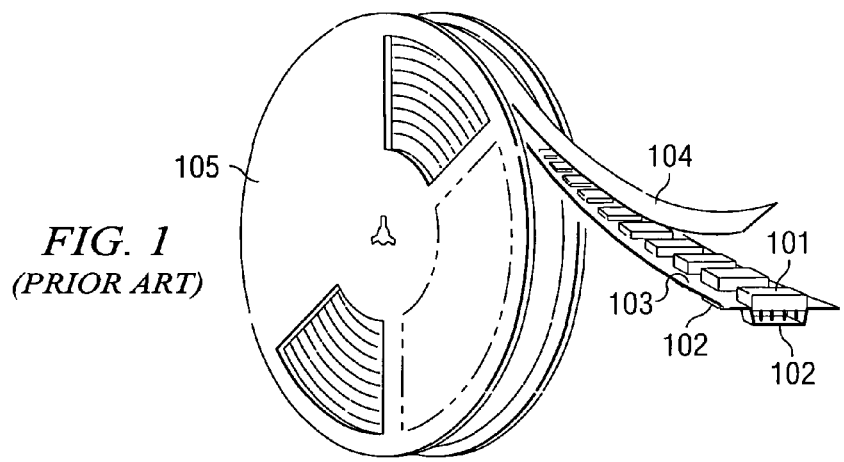
FIG. 1 is a prior art carrier tape and reel for holding and transporting semiconductor devices.
Figure 2A:
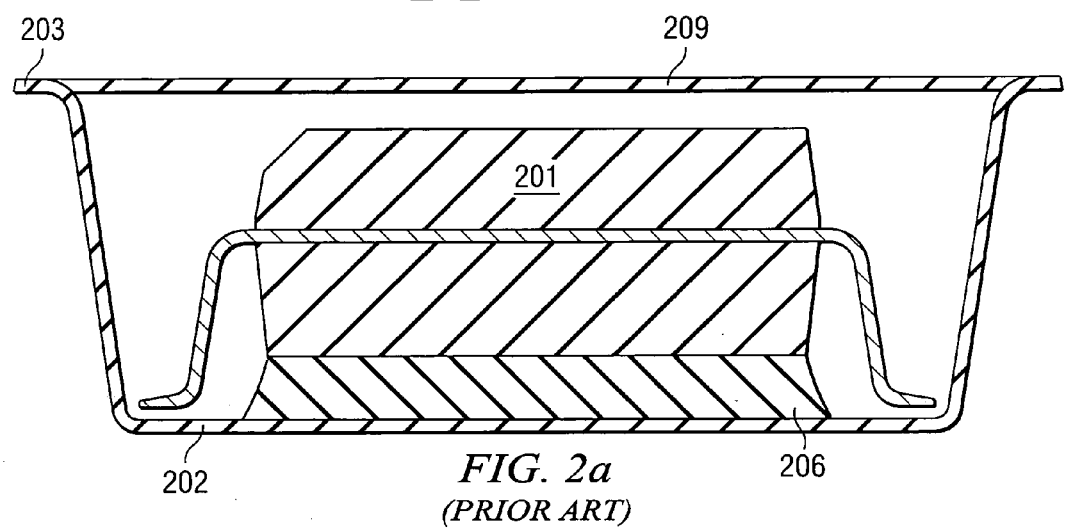
FIG. 2a shows a prior art pedestal in the tape pocket supporting a semiconductor device.
Figure 4C:
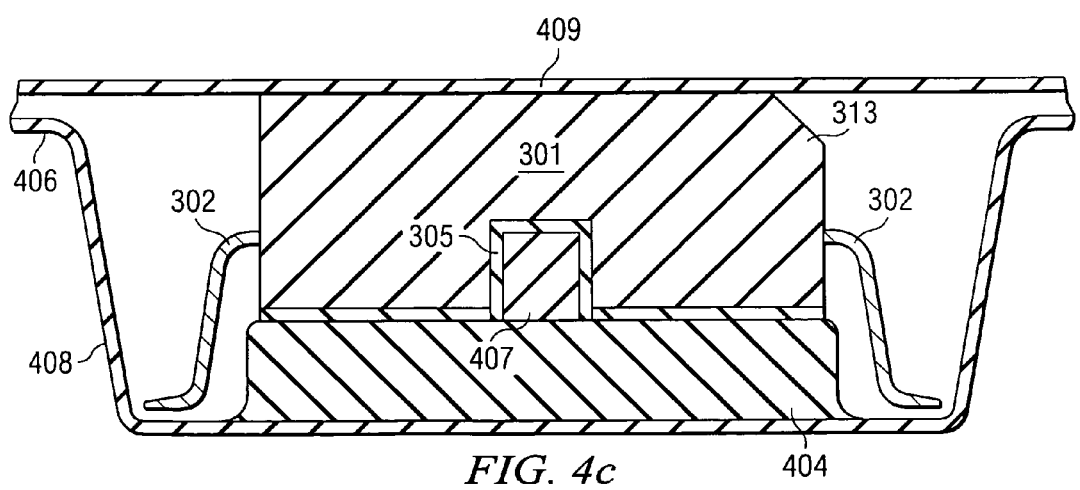
FIG. 4c is a view of dual inline package in a carrier tape with a cover tape securing the package.
Figure 2B:
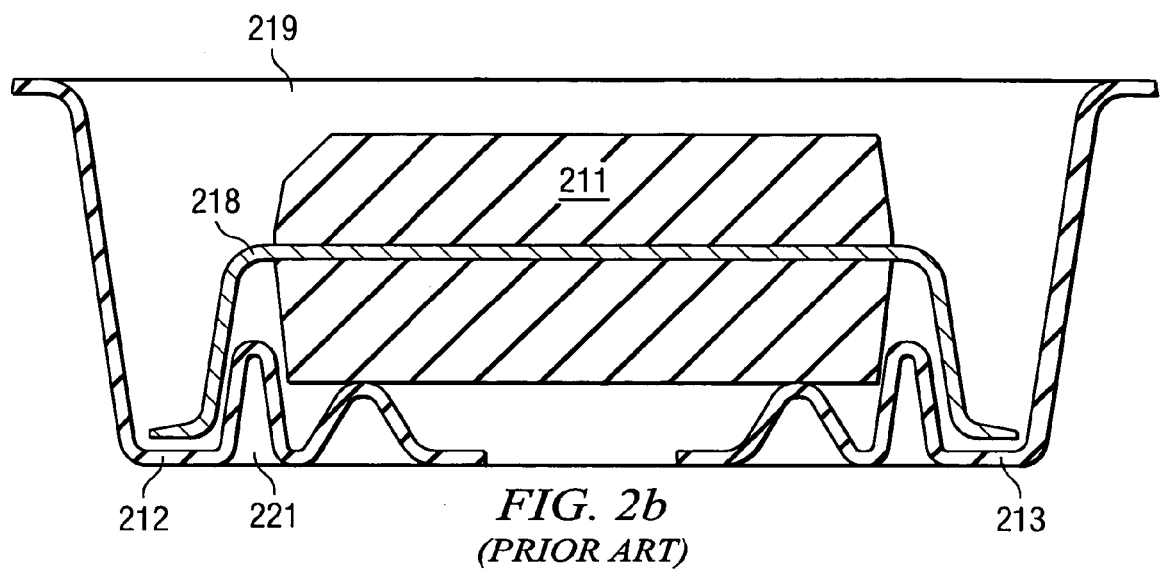
FIG. 2b illustrates prior art ridges in the carrier tape pocket designed to secure device leads.

As illustrated in FIGS. 4a and 4b, a carrier tape 406 is provided having a pocket 408 with a pedestal 404 sized to support the body of a given semiconductor device 301. Two protruding features 407 which mate with the notches 305 in the semiconductor device 301 are formed at the ends of the pedestal 404 within the pocket 408. The protruding features 407 are shaped and positioned to interlock with notches 305 in the semiconductor device package 301. The protrusions 407 are slightly smaller than the notches 305 so that the features are capable of interlocking. The embossed carrier tape 406 of a semi-flexible, deformable plastic material has two major surfaces with the inner surface referring to that surface inside the pocket facing the device. Techniques for forming carrier tapes with pedestals and other specific features are well known in the industry.

The tape 406 and device 301 assembly is illustrated from one of the two leaded sides 311 of the dual inline package 301 in FIG. 4a and from a side 313 having no leads in FIG. 4b. The method for protecting the leads 302 from impact damage during storage, shipping, or handling while housed in the tape carrier includes providing interlocking features on the semiconductor device 301 and carrier tape 406, aligning the interlocking notches 305 in the package to the protrusions 407 in the tape, and positioning the device 301 thereon, so as to interlock the tape and device horizontally. The process further includes adhering a cover tape 409 to edges of the carrier tape 406 so that the device 301 is held vertically on the pedestal 404 within the pocket. The interlocked tape and device features 305, 407 secure the device 301 from rotational or horizontal movement, and the correctly sized pocket 408, pedestal 404, and cover tape 409 secure the device vertically so that the leads 302 are unlikely to touch the side walls of the pocket 408 and incur damage.

Figure 5A:
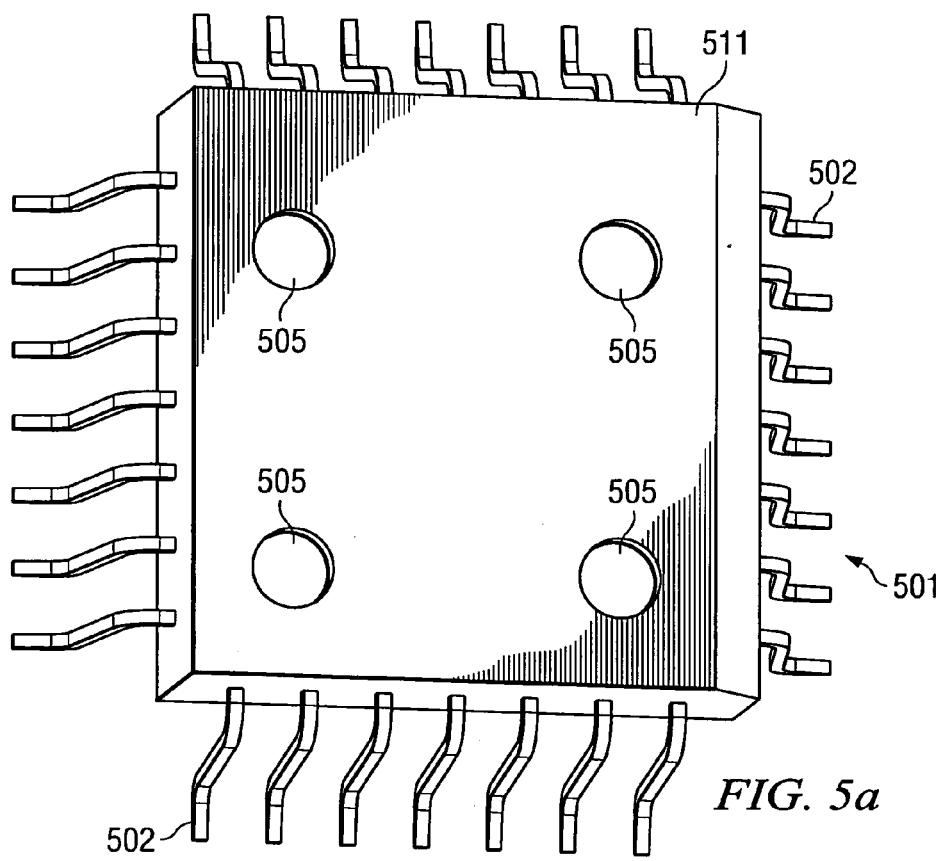
FIG. 5a is the underside of a semiconductor package having indentions in the package body.
Figure 5B:
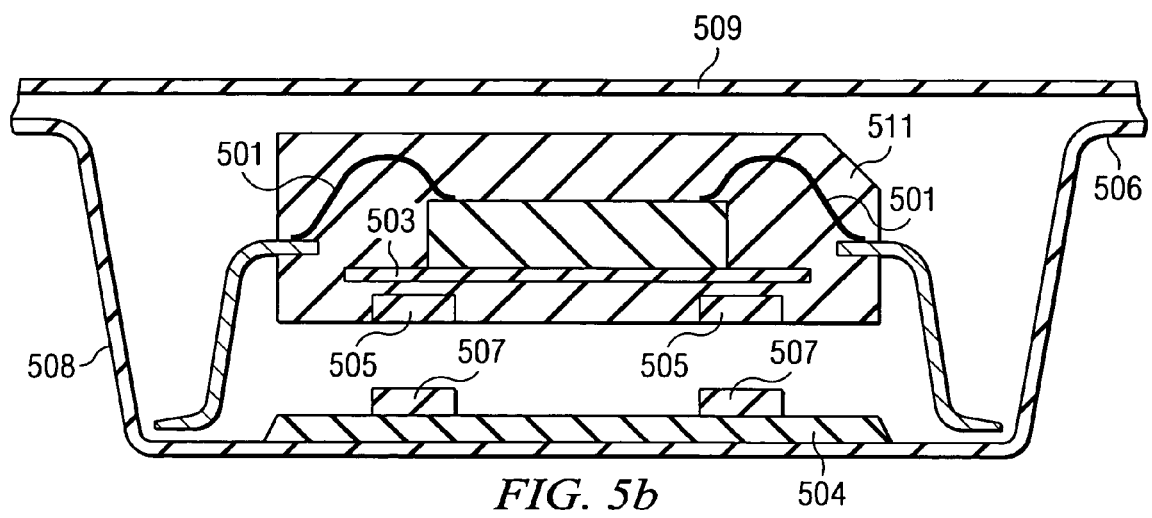
FIG. 5b depicts positioning a semiconductor package having indentations on interlocking protrusions in a carrier tape.

FIGS. 5a and 5b illustrate a second embodiment of the invention for securing a semiconductor device 501 having leads 502 protruding from two or more sides in a carrier tape 506. The method includes the steps of providing a semiconductor device 501 having indentations 505 formed in the underside 511 of the device body and providing a carrier tape 506 having pockets 508 with protrusions 507 from the pedestal 504 which mirror the device indentations 505. The method further includes the steps of aligning indentations 505 in the package body to tape protrusions 507, placing the device 501 on the protrusions 507, and securing the device vertically by adhering a cover tape 509 to the edges of the carrier tape 506.

It should be understood that a semiconductor package has two major horizontal surfaces and four vertical sides, and that the underside is a major surface facing the direction in which the leads are formed. In one embodiment, molded indentations in the underside of the package are preferably in the range of 0.25 to 1.0 mm in diameter and are about 0.1 to 0.3 mm in depth. The allowable indentation depth is largely dependent on the total package thickness and thickness of plastic under the chip pad 503. The indentations preferably do not intrude into the area occupied by the chip, chip pad, or other device feature, or render the molded thickness unreliable.

Indentations and the mating protrusions may be circular, as illustrated in FIG. 5a, or may be multi-sided. The embodiment having indentations molded into the underside of the package may be used with dual inline packages, as well as packages having leads on four (4) sides, as illustrated in FIG. 5a.

The mating protrusions and indentations may be placed in a single row or other configuration. An advantage of a triangular arrangement, as shown in FIG. 5a, is that it provides an alignment direction for the device in the carrier tape. In any configuration, it is preferable that more than one mating feature be present in each carrier pocket and device in order to prevent lateral movement of the device.

In yet another embodiment, an assemblage for housing and transporting a semiconductor device without damage to the leads comprises a molded semiconductor device having indentation features formed in the device body, an embossed carrier tape having protrusions formed in the pocket of the tape which interlock with the indentations on the device, and a cover tape adhered to the edges of the carrier tape. The tape further includes a pedestal in the base of the pocket which is sized to conform to the semiconductor device body. The pocket depth, pedestal size, and cover tape prevent significant vertical movement of the device and the interlocking indentation and protrusions prevent significant lateral movement. The combination of the above mentioned features allows a device to be secured in the carrier tape and avoid damage to the leads during storage or transportation.

Although the invention has been described with respect to specific preferred embodiments, many variations and modifications will become apparent to those skilled in the art upon reading the present application. It is therefore intended that the appended claims be interpreted as broadly as possible in view of the prior art to include all such variations and modifications.

What is claimed is:

1. A package semiconductor device, comprising:
   an embossed carrier tape having a pocket and a protruding feature in said pocket;
   a package semiconductor device having a top surface and a bottom surface, said semiconductor device including an indentation in the bottom surface, said protruding feature of said embossed carrier tape interlocked in said indentation in the bottom surface of said semiconductor device; and
   a cover over said pocket, said cover in contact with said top surface of said semiconductor device.

2. A package semiconductor device, comprising:
   an embossed carrier tape having a pocket and a protruding feature in said pocket;
   a package semiconductor device having a top surface and a bottom surface, said semiconductor device including an indentation in the bottom surface, said protruding feature of said embossed carrier tape interlocked in said indentation in the bottom surface of said semiconductor device; and
   wherein said indentation extends form said bottom surface to said top surface of said semiconductor device.

3. A package semiconductor device, comprising:
   an embossed carrier tape having a pocket and a protruding feature in said pocket;
   a package semiconductor device having a top surface and a bottom surface, said semiconductor device including an indentation in the bottom surface, said protruding feature of said embossed carrier tape interlocked in said indentation in the bottom surface of said semiconductor device; and
   wherein said indentation is one of a plurality of indentation in said bottom surface arranged in a pattern, and said embossed carrier tape comprises a pocket having a plurality of protruding features in an arrangement corresponding to said pattern of indentations in said bottom surface of said semiconductor device.

* * * * *